US011980026B2

(12) United States Patent
Lai et al.

(10) Patent No.: US 11,980,026 B2
(45) Date of Patent: May 7, 2024

(54) MAGNETORESISTIVE RANDOM ACCESS MEMORY FOR PHYSICALLY UNCLONABLE FUNCTION TECHNOLOGY AND ASSOCIATED RANDOM CODE GENERATING METHOD

(71) Applicant: eMemory Technology Inc., Hsin-Chu (TW)

(72) Inventors: Tsung-Mu Lai, Hsinchu County (TW); Chun-Yuan Lo, Hsinchu County (TW); Chun-Chieh Chao, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 213 days.

(21) Appl. No.: 17/839,519

(22) Filed: Jun. 14, 2022

(65) Prior Publication Data

US 2023/0052438 A1    Feb. 16, 2023

Related U.S. Application Data

(60) Provisional application No. 63/232,668, filed on Aug. 13, 2021.

(51) Int. Cl.
    *G11C 11/00*    (2006.01)
    *G11C 7/24*    (2006.01)
    (Continued)

(52) U.S. Cl.
    CPC ............. *H10B 20/20* (2023.02); *G11C 7/24* (2013.01); *G11C 11/1673* (2013.01);
    (Continued)

(58) Field of Classification Search
    CPC ....... H10B 20/20; G11C 7/24; G11C 11/1673; G11C 11/1675; G11C 11/1677;
    (Continued)

(56) References Cited

U.S. PATENT DOCUMENTS 7,499,314 B2 *   3/2009  Yang ....................... G11C 11/16
                                              365/158
8,400,824 B2 *   3/2013  Rho ..................... G11C 11/1697
                                              365/158

(Continued)

OTHER PUBLICATIONS

Jayita Das et al., "MRAM PUF: A Novel Geometry Based Magnetic PUF With Integrated CMOS", May 2015, pp. 436-443, vol. 14, No. 3, IEEE Transactions on Nanotechnology.
Office Action issued by Taiwan Intellectual Property Office on Apr. 10, 2023.

*Primary Examiner* — Viet Q Nguyen

(74) *Attorney, Agent, or Firm* — WPAT, P.C

(57) ABSTRACT

A random code generating method for the magnetoresistive random access memory is provided. Firstly, a first magnetoresistive random access memory cell and a second magnetoresistive random access memory cell are programmed into an anti-parallel state. Then, an initial value of a control current is set. Then, an enroll action is performed on the first and second magnetoresistive random access memory cells. If the first and second magnetoresistive random access memory cells fail to pass the verification action, the control current is increased by a current increment, and the step of setting the control current is performed again. If the first and second magnetoresistive random access memory cells pass the verification action, a one-bit random code is stored in the first magnetoresistive random access memory cell or the second magnetoresistive random access memory cell.

22 Claims, 8 Drawing Sheets

(51) Int. Cl.
  *G11C 11/16* (2006.01)
  *G11C 13/00* (2006.01)
  *H01L 23/525* (2006.01)
  *H10B 20/20* (2023.01)

(52) U.S. Cl.
  CPC ...... *G11C 11/1675* (2013.01); *G11C 11/1677* (2013.01); *G11C 13/003* (2013.01); *G11C 13/0038* (2013.01); *G11C 13/004* (2013.01); *G11C 13/0064* (2013.01); *H01L 23/5256* (2013.01); *G11C 2013/0045* (2013.01); *G11C 2213/79* (2013.01)

(58) Field of Classification Search
  CPC . G11C 13/003; G11C 13/0038; G11C 13/004; G11C 13/0064; G11C 2013/0045; G11C 2213/79; H01L 23/5265
  USPC .......................................................... 365/158
  See application file for complete search history.

(56) References Cited

U.S. PATENT DOCUMENTS

| | | | |
|---|---|---|---|
| 8,472,242 B2 * | 6/2013 | Shimomura | G11C 11/1659 |
| | | | 365/158 |
| 8,953,363 B2 * | 2/2015 | Shimakawa | G11C 13/004 |
| | | | 365/175 |
| 9,613,714 B1 | 4/2017 | Wong et al. | |
| 9,997,244 B1 | 6/2018 | Chih et al. | |
| 10,574,469 B1 | 2/2020 | Garni et al. | |
| 11,049,557 B2 * | 6/2021 | Chou | G11C 13/003 |
| 11,101,326 B2 * | 8/2021 | Nardi | H10N 70/231 |
| 11,823,739 B2 * | 11/2023 | Asnaashari | G09C 1/00 |
| 2015/0071432 A1 | 3/2015 | Zhu et al. | |
| 2017/0200508 A1 | 7/2017 | Grigoriev et al. | |
| 2017/0214532 A1 | 7/2017 | Das et al. | |
| 2018/0102155 A1 | 4/2018 | Tang et al. | |
| 2019/0369966 A1 * | 12/2019 | Hsu | G11C 13/0004 |

* cited by examiner

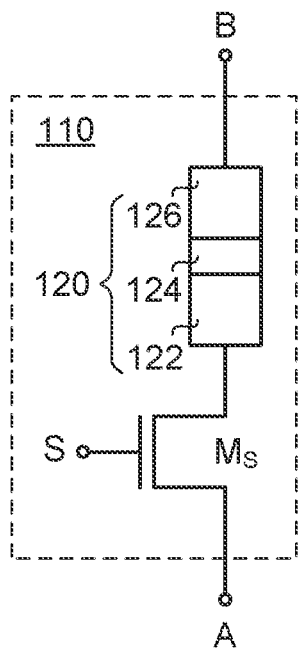
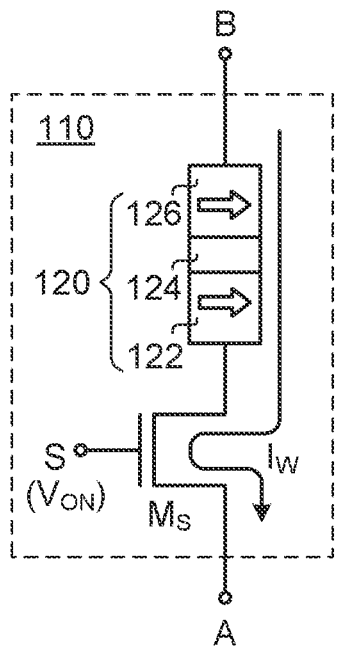
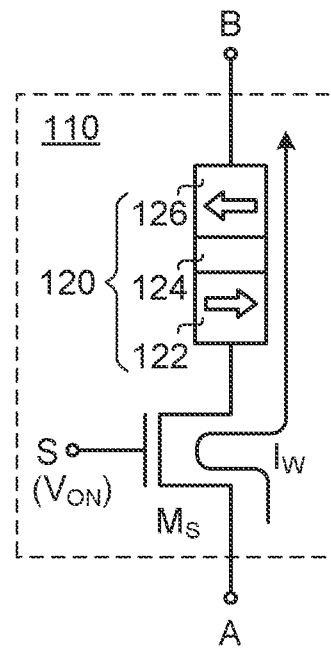
FIG. 1 (prior art)
FIG. 2A (prior art)
FIG. 2B (prior art)
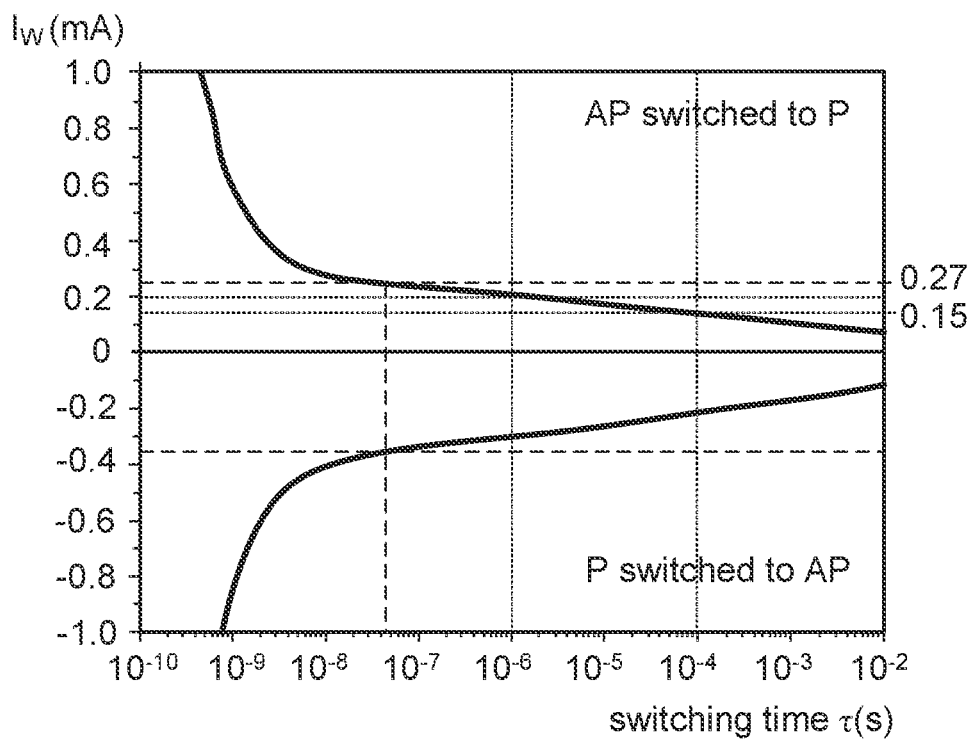
FIG. 3 (prior art)

MAGNETORESISTIVE RANDOM ACCESS MEMORY FOR PHYSICALLY UNCLONABLE FUNCTION TECHNOLOGY AND ASSOCIATED RANDOM CODE GENERATING METHOD

This application claims the benefit of U.S. provisional application Ser. No. 63/232,668, filed Aug. 13, 2021, the subject matter of which is incorporated herein by reference.

FIELD OF THE INVENTION

The present invention relates to a memory, and more particularly to a magnetoresistive random access memory (MRAM) for a physically unclonable function (PUF) technology and an associated random code generating method.

BACKGROUND OF THE INVENTION

FIG. 1 is a schematic circuit diagram illustrating a conventional MRAM cell. The MRAM cell is a spin-transfer-torque magnetoresistive random access cell. As shown in FIG. 1, the conventional MRAM cell 110 comprises a switch transistor $M_S$ and a storage element 120. The storage element 120 is also referred as a magnetic tunnel junction (MTJ).

The MRAM cell 110 has three ends A, B and S. The first drain/source terminal of the switch transistor $M_S$ is connected with the first end A. The gate terminal of the switch transistor $M_S$ is connected with the control end S. For example, the switch transistor $M_S$ is an NMOS transistor.

The storage element 120 comprises a pin layer 122, an isolation layer 124 and a free layer 126, which are arranged in a stack form. The pin layer 122 of the storage element 120 is connected with the second drain/source terminal of the switch transistor $M_S$. The free layer 126 of the storage element 120 is connected with the second end B. Generally, the magnetization direction of the pin layer 122 is unchangeable, but the magnetization direction of the free layer 126 is changeable.

The MRAM cell 110 as shown in FIG. 1 has other configurations. For example, in another configuration, the pin layer 122 of the storage element 120 is connected with the second end B, and the free layer 126 of the storage element 120 is connected with the second drain/source terminal of the switch transistor $M_S$.

In case that the magnetization directions of the pin layer 122 and the free layer 126 are different, the MRAM cell 110 is in an anti-parallel state (also referred as an AP state). In the AP state, the storage element 120 has the higher impedance (e.g., 5.2 kohms). Under this circumstance, the MRAM cell 110 is in a high impedance state.

Whereas, in case that the magnetization directions of the pin layer 122 and the free layer 126 are identical, the MRAM cell 110 is in a parallel state (also referred as a P state). In the P state, the storage element 120 has the lower impedance (e.g., 3.2 kohms). Under this circumstance, the MRAM cell 110 is in a low impedance state.

During a program operation, the write currents in different directions are selectively provided to the storage element 120. Consequently, the MRAM cell 110 is switched between the AP state and the P state. The AP state and the P state can be considered as two storage states. For example, the AP state is a logic "1" state, and the P state is a logic "0" state. FIGS. 2A and 2B are schematic circuit diagrams illustrating the MRAM cell in the P state and the AP state.

Please refer to FIG. 2A. While the program action is performed, an on voltage $V_{ON}$ is provided to the control end S to turn on the switch transistor $M_S$ and a write current $I_W$ is provided from the second end B to the first end A. When the write current $I_W$ flows through the storage element 120, the magnetization directions of the pin layer 122 and the free layer 126 are identical. Consequently, the MRAM cell 110 is in the P state.

Please refer to FIG. 2B. While the program action is performed, the on voltage $V_{ON}$ is provided to the control end S to turn on the switch transistor $M_S$ and a write current $I_W$ is provided from the first end A to the second end B. When the write current $I_W$ flows through the storage element 120, the magnetization directions of the pin layer 122 and the free layer 126 are different. Consequently, the MRAM cell 110 is in the AP state. As shown in FIGS. 2A and 2B, the directions of the write currents $I_W$ are opposite.

From the discussions in FIGS. 2A and 2B, the following results can be obtained. In case that the write current $I_W$ in a first direction (i.e., the direction from the second end B to the first end A) flows through the storage element 120 during the program action, the storage state of the MRAM cell 110 is switched from the AP state to the P state. Whereas, in case that the write current $I_W$ in a second direction (i.e., the direction from the first end A to the second end B) flows through the storage element 120 during the program action, the storage state of the MRAM cell 110 is switched from the P state to the AP state.

FIG. 3 is a plot illustrating the relationship between the write current and the switching time when the state of the storage element is switched. Generally, as the magnitude of the write current $I_W$ decreases, the switching time ($\tau$) for switching the state of the storage element 120 increases.

The situation of switching the AP state to the P state will be described as follows. In case that the magnitude of the write current $I_W$ provided to the MRAM cell 110 is 0.27 mA, the switching time ($\tau$) for switching the state of the storage element 120 from the AP state to the P state is about 45 ns. In case that the magnitude of the write current $I_W$ provided to the MRAM cell 110 is 0.20 mA, the switching time ($\tau$) for switching the state of the storage element 120 from the AP state to the P state is about 1 µs. In case that the magnitude of the write current $I_W$ provided to the MRAM cell 110 is 0.15 mA, the switching time ($\tau$) for switching the state of the storage element 120 from the AP state to the P state is about 0.1 ms.

Similarly, as the magnitude of the write current $I_W$ decreases, the switching time ($\tau$) for switching the state of the storage element 120 from the P state to the AP state increases.

As mentioned above, if the magnitude of the write current $I_W$ provided to the MRAM cell 110 is decreased from 0.20 mA to 0.15 mA, the switching time ($\tau$) for switching the state of the storage element 120 from the AP state to the P state is increased from 1 µs to 0.1 ms. In other words, the switching time ($\tau$) increases for about 1000 times.

When a read action of the MRAM cell 110 is performed, the storage state of the MRAM cell 110 can be judged. For example, when the read action is performed, the on voltage $V_{ON}$ is provided to the control end S, and the voltage difference between the first end A and the second B is equal to a read voltage $V_R$. For example, the read voltage $V_R$ is 0.1V.

After the switch transistor $M_S$ is turned on, the MRAM cell 110 generates a read current. The storage state of the MRAM cell 110 can be determined according to the magnitude of the read current. For example, a reference current is provided, and the read current and the reference current are compared with each other. If the read current is higher than the reference current, the MRAM cell 110 is in the P state. Whereas, if the read current is lower than the reference current, the MRAM cell 110 is in the AP state.

A physically unclonable function (PUF) technology is a novel method for protecting the data of a semiconductor chip. That is, the use of the PUF technology can prevent the data of the semiconductor chip from being stolen. In accordance with the PUF technology, the semiconductor chip has a unique identity code (ID code) to achieve the protecting function.

Moreover, U.S. Pat. No. 9,613,714 disclosed a one time programming cell and a memory array for a PUF technology and an associated random code generating method. In this literature, a one time programmable cell and a memory array are manufactured according to the semiconductor process variation. After the program cycle, the unique random code is generated. Generally, the PUF technology acquires the unique identity code of the semiconductor chip according to the process variation of the semiconductor chip. That is, even if the PUF semiconductor chip is produced by a precise fabricating process, the identity code cannot be duplicated. Consequently, the PUF semiconductor chip is suitably used in the applications with high security requirements.

SUMMARY OF THE INVENTION

The present invention provides a magnetoresistive random access memory (MRAM) for a physically unclonable function (PUF) technology according to the characteristics of the magnetoresistive random access memory. The present invention also provides a random code generating method for allowing the magnetoresistive random access memory to generate random codes.

An embodiment of the present invention provides a magnetoresistive random access memory. The magnetoresistive random access memory includes a memory cell array, a current source, a select circuit, a first sensing element, a second sensing element, a current source, a select circuit and a judging element. The memory cell array includes a first magnetoresistive random access memory cell and a second magnetoresistive random access memory cell. A control end of the first magnetoresistive random access memory cell is connected to a word line. A first end of the first magnetoresistive random access memory cell is connected to a first source line. A second end of the first magnetoresistive random access memory cell is connected to a first bit line. A control end of the second magnetoresistive random access memory cell is connected to the word line. A first end of the second magnetoresistive random access memory cell is connected to a second source line. A second end of the second magnetoresistive random access memory cell is connected to a second bit line. The current source receives a control signal and generates a control current according to the control signal. The select circuit is connected to the current source, the first bit line and the second bit line. A first input terminal of the first sensing element is connected to the select circuit. A second input terminal of the first sensing element receives a reference current. An output terminal of the first sensing element generates a first sensing signal. A first input terminal of the second sensing element is connected to the select circuit. A second input terminal of the second sensing element receives the reference current. An output terminal of the second sensing element generates a second sensing signal. A first input terminal of the judging element is connected to the output terminal of the first sensing element. A second input terminal of the judging element is connected to the output terminal of the second sensing element. An output terminal of the judging element generates a verification signal. Both of the first magnetoresistive random access memory cell and the second magnetoresistive random access memory cell are originally in an anti-parallel state. While an enroll action is performed, the current source is connected to the first bit line and the second bit line through the select circuit. Consequently, a first portion of the control current flows through the first magnetoresistive random access memory cell, and a second portion of the control current flows through the second magnetoresistive random access memory cell. While a verification action is performed, the first bit line and the second bit line are respectively connected to the first input terminal of the first sensing element and the first input terminal of the second sensing element through the select circuit. Consequently, a first read current generated by the first magnetoresistive random access memory cell flows to the first sensing element, and a second read current generated by the second magnetoresistive random access memory cell flows to the second sensing element.

Another embodiment of the present invention provides a random code generating method for the magnetoresistive random access memory. In a step (a), the first magnetoresistive random access memory cell and the second magnetoresistive random access memory cell are programmed into the anti-parallel state. In a step (b), an initial value of the control current is set. In a step (c), the enroll action is performed on the first magnetoresistive random access memory cell and the second magnetoresistive random access memory cell. In a step (d), if the first magnetoresistive random access memory cell and the second magnetoresistive random access memory cell fail to pass the verification action, the control current is increased by a current increment, and the step (c) is performed again. In a step (e), if the first magnetoresistive random access memory cell and the second magnetoresistive random access memory cell pass the verification action, the random code generating process is ended. Then, a one-bit random code is stored in the first magnetoresistive random access memory cell or the second magnetoresistive random access memory cell.

Another embodiment of the present invention provides a magnetoresistive random access memory. The magnetoresistive random access memory includes a memory cell array, a current source, a select circuit, a first sensing element, a second sensing element, a current source, a select circuit and a judging element. The memory cell array includes m×2n magnetoresistive random access memory cells in an m×2n array arrangement. The memory cell array is connected to m word lines, 2n bit lines and 2n source lines. Moreover, 2n magnetoresistive random access memory cells in a first row of the memory cell array are collaboratively formed as n magnetoresistive random access memory cell pairs. The control ends of the 2n magnetoresistive random access memory cells are connected to a first word line. The first ends of the 2n magnetoresistive random access memory cells are connected to corresponding 2n source lines. The second ends of the 2n magnetoresistive random access memory cell are connected to corresponding n bit lines. The current source receives a control signal and generates a control current according to the control signal. The select circuit is connected to the current source and the 2n bit lines. A first input terminal of the first sensing element is connected to the select circuit. A second input terminal of the first sensing element receives a reference current. An output terminal of the first sensing element generates a first sensing signal. A first input terminal of the second sensing element is connected to the select circuit. A second input terminal of the second sensing element receives the reference current. An output terminal of the second sensing element generates a second sensing signal. A first input terminal of the judging element is connected to the output terminal of the first sensing element. A second input terminal of the judging element is connected to the output terminal of the second sensing element. An output terminal of the judging element generates a verification signal. While an enroll action is performed, the current source is connected to a pair of bit lines of the 2n bit lines through the select circuit, and the current source is connected to a specified magnetoresistive random access memory cell pair of the n magnetoresistive random access memory cell pairs. Consequently, a first portion of the control current flows through a first magnetoresistive random access memory cell of the specified magnetoresistive random access memory cell pair, and a second portion of the control current flows through a second magnetoresistive random access memory cell of the specified magnetoresistive random access memory cell pair. While a verification action is performed, the pair of bit lines of the 2n bit lines are respectively connected to the first input terminal of the first sensing element and the first input terminal of the second sensing element through the select circuit. Consequently, a first read current generated by the first magnetoresistive random access memory cell of the specified magnetoresistive random access memory cell pair flows to the first sensing element, and a second read current generated by the second magnetoresistive random access memory cell of the specified magnetoresistive random access memory cell pair flows to the second sensing element.

Another embodiment of the present invention provides a random code generating method for the magnetoresistive random access memory. In a step (a), the m×2n magnetoresistive random access memory cells of the memory cell array are programmed into an anti-parallel state. In a step (b), a selected row of the memory cell array is determined. In a step (c), an initial value of the control current is set. In a step (d), the enroll action is performed on plural magnetoresistive random access memory cell pairs in the selected row sequentially, wherein the plural magnetoresistive random access memory cell pairs have not passed verification action. In a step (e), if at least one magnetoresistive random access memory cell pair in the selected row fails to pass the verification action, the control current is increased by a current increment, and the step (d) is performed again. In a step (f), if all of the magnetoresistive random access memory cell pairs in the selected row pass the verification action and the selected row is not a last row of the memory cell array, a next selected row is determined, and the step (c) is performed again. In a step (g), if all of the magnetoresistive random access memory cell pairs in the selected row pass the verification action and the selected row is the last row of the memory cell array, the random code generating process is ended. Then, an m×n-bit random code is stored in the memory cell array after the step (g) is performed.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) is a schematic circuit diagram illustrating a conventional MRAM cell;

FIGS. 2A and 2B (prior art) are schematic circuit diagrams illustrating the MRAM cell in the P state and the AP state;

FIG. 3 (prior art) is a plot illustrating the relationship between the write current and the switching time when the state of the storage element is switched;

DETAILED DESCRIPTION OF PREFERRED EMBODIMENTS

Figure 4A:
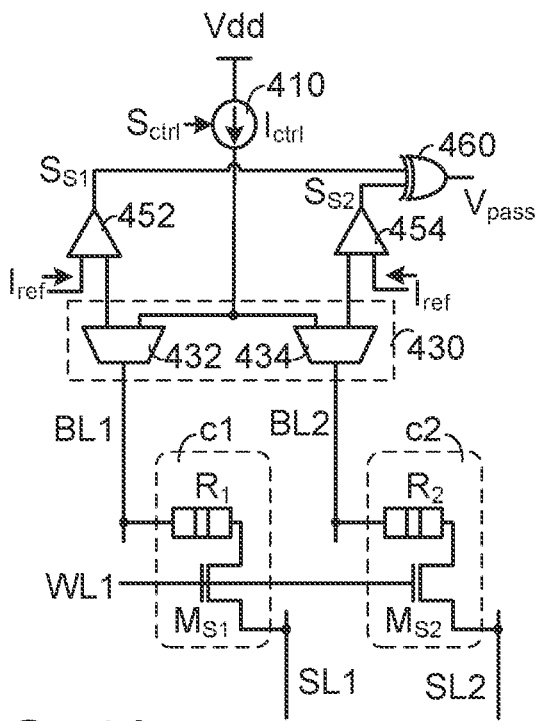
FIG. 4A is a schematic circuit diagram illustrating a magnetoresistive random access memory (MRAM) for a physically unclonable function (PUF) technology according to a first embodiment of the present invention.

FIG. 4A is a schematic circuit diagram illustrating a magnetoresistive random access memory (MRAM) for a physically unclonable function (PUF) technology according to a first embodiment of the present invention. The magnetoresistive random access memory comprises a MRAM cell array, a current source 410, a select circuit 430, two sensing elements 452, 454, and a judging element 460.

The MRAM cell array comprises two MRAM cells c1 and c2 in a 1×2 array arrangement. The MRAM cells c1 and c2 are collaboratively formed as a MRAM cell pair. The MRAM cell c1 comprises a switch transistor $M_{S1}$ and a storage element $R_1$. The MRAM cell c2 comprises a switch transistor $M_{S2}$ and a storage element $R_2$. FIG. 4A illustrates that the switch transistors $M_{S1}$, $M_{S2}$ are N-type transistors, in some embodiments, the switch transistors $M_{S1}$, $M_{S2}$ can be P-type transistors. The structures of the MRAM cells c1 and c2 are similar to the structure of the MRAM cell 110 as shown in FIG. 1, and not redundantly described herein.

The first end of the MRAM cell c1 is connected to the source line SL1. The second end of the MRAM cell c1 is connected to the bit line BL1. The control end of the MRAM cell c1 is connected to the word line WL1. The first end of the MRAM cell c2 is connected to the source line SL2. The second end of the MRAM cell c2 is connected to the bit line BL2. The control end of the MRAM cell c2 is connected to the word line WL1.

The current source 410 is connected between a power supply voltage Vdd and the select circuit 430. While an enroll action is performed, the current source 410 generates the control current $I_{ctrl}$. The control current $I_{ctrl}$ is a current pulse with a fixed pulse width. The magnitude of the control current $I_{ctrl}$ is equal to the pulse height of the current pulse. According to a control signal $S_{ctrl}$, the current source 410 adjusts the magnitude of the control current $I_{ctrl}$. That is, the pulse height of the current pulse can be adjusted according to the control signal $S_{ctrl}$.

The select circuit 430 includes two select elements 432 and 434. The first terminal of the select element 432 is connected to the current source 410. The second terminal of the select element 432 is connected to the sensing element 452. The third terminal of the select element 432 is connected to the bit line BL1. The first terminal of the select element 434 is connected to the current source 410. The second terminal of the select element 434 is connected to the sensing element 454. The third terminal of the select element 434 is connected to the bit line BL2. During the enroll action, the first end and the third end of the select element 432 are connected with each other, and the first end and the third end of the select element 434 are connected with each other. During a verification action, the second end and the third end of the select element 432 are connected with each other, and the second end and the third end of the select element 434 are connected with each other.

During the verification action, the sensing elements 452 and 454 and the judging element 460 are enabled. The first input terminal of the sensing element 452 is connected to the second terminal of the select element 432. The second input terminal of the sensing element 452 receives a reference current $I_{ref}$. The output terminal of the sensing element 452 generates a sensing signal $S_{S1}$. The first input terminal of the sensing element 454 is connected to the second terminal of the select element 434. The second input terminal of the sensing element 454 receives the reference current $I_{ref}$. The output terminal of the sensing element 454 generates a sensing signal $S_{S2}$. In an embodiment, the sensing elements 452 and 454 are current comparators.

The two input terminals of the judging element 460 are connected to the output terminals of the sensing elements 452 and 454 for receiving the sensing signals $S_{S1}$ and $S_{S2}$. For example, the judging element 460 is an XOR gate. During the verification operation, the output terminal of the judging element 460 generates a verification signal $V_{pass}$ to indicate whether the MRAM cell pair pass the verification action or not.

Figure 4B:
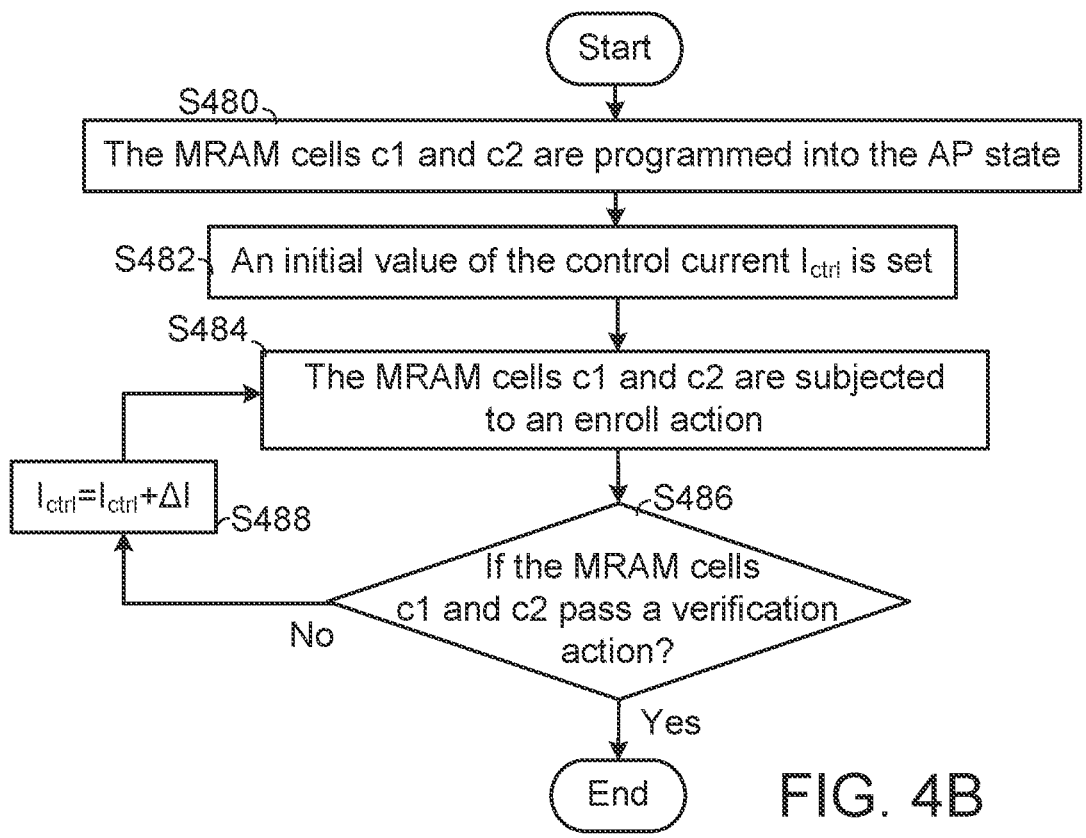
FIG. 4B is a flowchart illustrating a random code generating method for the magnetoresistive random access memory according to the first embodiment of the present invention.

FIG. 4B is a flowchart illustrating a random code generating method for the magnetoresistive random access memory according to the first embodiment of the present invention. Firstly, the MRAM cells c1 and c2 are programmed into the AP state (Step S480). Then, an initial value of the control current $I_{ctrl}$ is set (Step S482). That is, the control current $I_{ctrl}$ is adjusted according to the control signal $S_{ctrl}$.

Then, the MRAM cells c1 and c2 are subjected to an enroll action (Step S484). While the enroll action is performed, the control current $I_{ctrl}$ is divided into two portions, and the two portions are respectively provided to the MRAM cells c1 and c2 of the MRAM cell pair. That is, while the enroll action is performed, a first portion of the control current $I_{ctrl}$ is provided to the MRAM cell c1, and a second portion of the control current $I_{ctrl}$ is provided to the MRAM cell c2. Then, a step S486 is performed to judge whether the MRAM cell pair pass a verification action.

If the judging condition of the step S486 is not satisfied, the control current $I_{ctrl}$ is increased by a current increment (i.e., Ictrl=Ictrl+ΔI) (Step S488), and the step S484 is repeatedly done. That is, the control current $I_{ctrl}$ is adjusted according to the control signal $S_{ctrl}$. Consequently, the pulse height of the current pulse is increased.

Whereas, if the judging condition of the step S486 is satisfied, the random code generating process is ended. Under this circumstance, the storage state of the MRAM cell c1 or the MRAM cell c2 can be used as a one-bit random code. In other words, the MRAM cell array has generated a one-bit random code, and the one-bit random code is stored in the MRAM cell c1 or the MRAM cell c2 of the MRAM cell array.

FIGS. 5A to 5D schematically illustrate the operations of the random code generating method in different stages and the timing waveforms of associated signals.

Figure 5A:
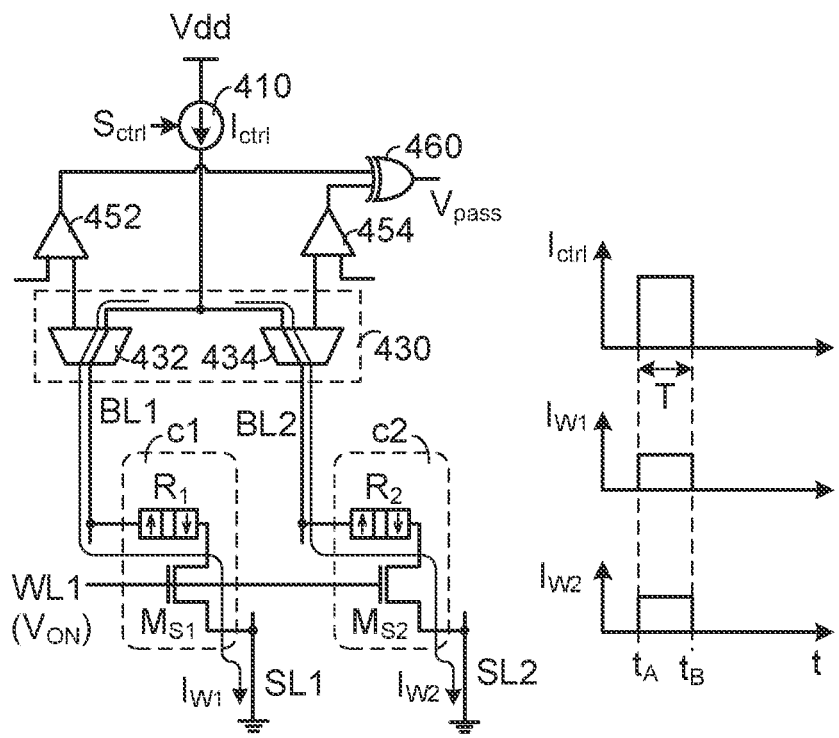
FIGS. 5A to 5D schematically illustrate the operations of the random code generating method in different stages and the timing waveforms of associated signals.

Please refer to FIG. 5A. The storage elements $R_1$ and $R_2$ in the MRAM cells c1 and c2 of the MRAM cell pair have been programmed to the AP state. The time interval between the time point $t_A$ and the time point $t_B$ is an enroll cycle. Meanwhile, the current source 410 generates the control circuit $I_{ctrl}$. The magnitude of the control circuit $I_{ctrl}$ represents the pulse height of the current pulse. The current pulse has a fixed pulse width T.

While the enroll action is performed, the first end and the third end of the select element 432 are connected with each other, and the first end and the third end of the select element 434 are connected with each other. Consequently, the current source 410 is connected to the bit lines BL1 and BL2. In addition, the word line WL1 receives the on voltage $V_{ON}$, and the source lines SL1 and SL2 are connected to the ground terminal to receive the ground voltage (i.e., 0V). Consequently, the control current $I_{ctrl}$ generated by the current source 410 is divided into two portions (i.e., the write currents $I_{W1}$ and $I_{W2}$), wherein $I_{ctrl}=I_{W1}+I_{W2}$. The two portions of the control current $I_{ctrl}$ flow to the two MRAM cells c1 and c2, respectively.

Since the MRAM cells c1 and c2 are in AP state, the magnitude of the write current $I_{W1}$ is almost equal to the magnitude of the write current $I_{W2}$. The write current $I_{W1}$ flows to the ground terminal through the select element 432, the bit line BL1, the storage element $R_1$, the select transistor $M_{S1}$ and the source line SL1. The write current $I_{W2}$ flows to the ground terminal through the select element 434, the bit line BL2, the storage element $R_2$, the select transistor $M_{S2}$ and the source line SL2.

Please refer to FIG. 5A again. After the predetermined time period T (i.e., the pulse width) of the write current $I_{W1}$, the MRAM cell c1 is still maintained in the AP state, and the storage state is unchanged. Similarly, after the predetermined time period T (i.e., the pulse width) of the write current $I_{W2}$, the MRAM cell c2 is still remained in the AP state, and the storage state is unchanged.

Figure 5B:
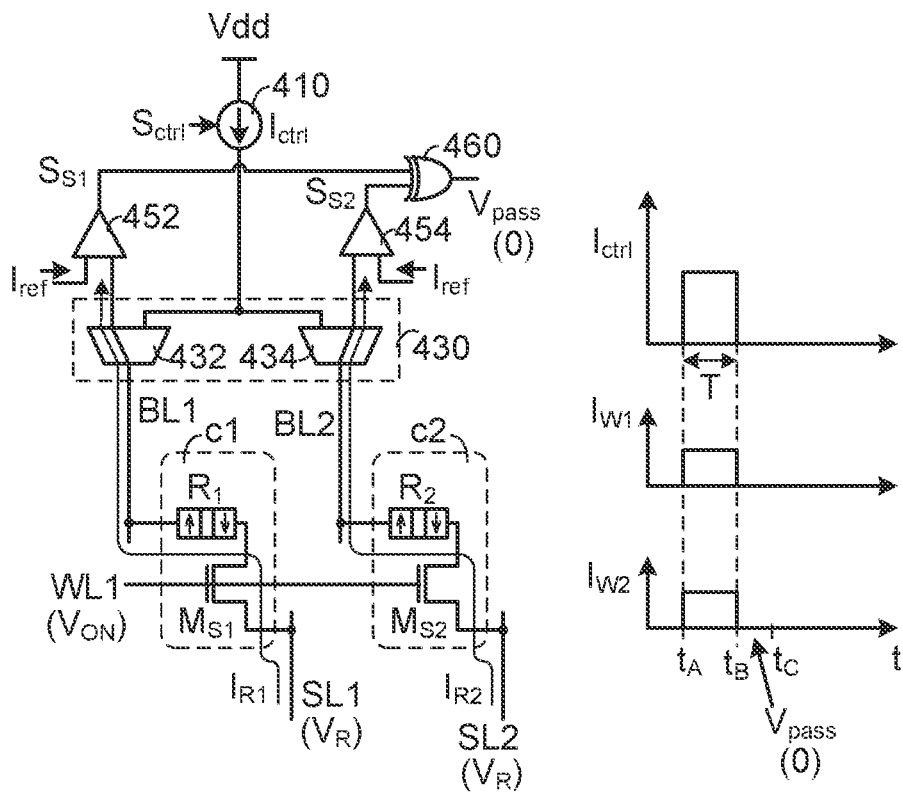

Please refer to FIG. 5B. After the enroll cycle, the time interval between the time point $t_B$ and the time point $t_C$ is a verification cycle. While the verification action is performed, the second end and the third end of the select element 432 are connected with each other, and the second end and the third end of the select element 434 are connected with each other. Consequently, the first input terminal of the sensing element 452 is connected to the bit line BL1, and the first input terminal of the sensing element 454 is connected to the bit line BL2. In addition, the word line WL1 receives the on voltage $V_{ON}$, and the source lines SL1 and SL2 receives the read voltage $V_R$. Consequently, the read currents $I_{R1}$ and $I_{R2}$ generated by the MRAM cells c1 and c2 flow to the sensing elements 452 and 454, respectively. The read current $I_{R1}$ flows to the sensing element 452 through the source line SL1, the select transistor $M_{S1}$, the storage element $R_1$, the bit line BL1 and the select element 432. The read current $I_{R2}$ flows to the sensing element 454 through the source line SL2, the select transistor $M_{S2}$, the storage element $R_2$, the bit line BL2 and the select element 434. Since both of the MRAM cells c1 and c2 are in the AP state, the magnitude of the read current $I_{R1}$ and the magnitude of the read current $I_{R2}$ are very small and lower than the reference current $I_{ref}$. Consequently, the sensing signals $S_{S1}$ and $S_{S2}$ generated by the sensing elements 452 and 454 have the same logic level to indicate that the MRAM cells c1 and c2 are both in the AP state. Since the sensing signals $S_{S1}$ and $S_{S2}$ have the same logic level, the verification signal $V_{pass}$ generated by the judging element 460 is in a logic low level state "0" to indicate that the MRAM cell pair fail to pass the verification action.

If the verification action fails, the control current $I_{ctrl}$ is increased by the current increment $\Delta I$. That is, Ictrl=Ictrl+$\Delta I$. In the time interval between the time point $t_C$ and the time point $t_D$, another enroll action is performed. After the enroll action, the verification action is performed. If the verification action fails, the control current $I_{ctrl}$ is further increased by the current increment $\Delta I$. The rest may be deduced by analog.

Figure 5C:
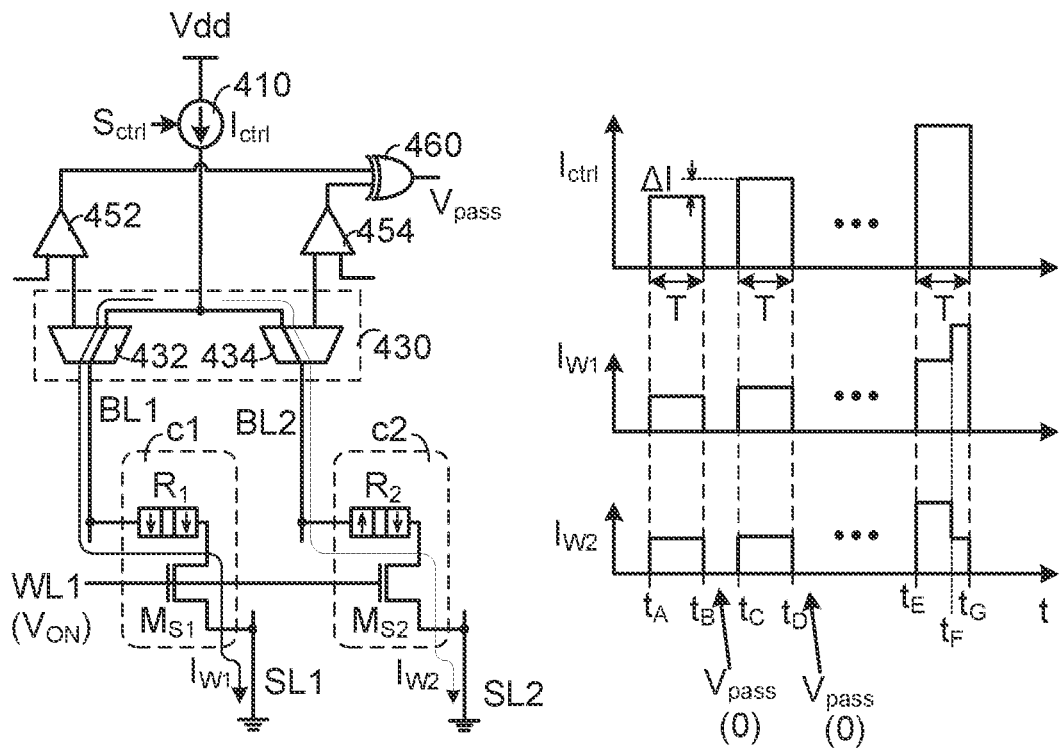

After the enroll action and the verification action are performed for many times, the situation in FIG. 5C is shown. In the time interval between the time point $t_E$ and the time point $t_G$, another enroll action is performed. In addition, the current source 410 generates the control current $I_{ctrl}$ Similarly, during the enroll action, the current source 410 is connected to the bit lines BL1 and BL2 through the select circuit 430. In addition, the word line WL1 receives the on voltage $V_{ON}$, and the source lines SL1 and SL2 are connected to the ground terminal to receive the ground voltage (i.e., 0V). Consequently, the control current $I_{ctrl}$ generated by the current source 410 is divided into two portions (i.e., the write currents $I_{W1}$ and $I_{W2}$), wherein $I_{ctrl}=I_{W1}+I_{W2}$. The two portions of the control current $I_{ctrl}$ flow to the two MRAM cells c1 and c2, respectively.

Please refer to FIG. 5C again. In the early stage of the enroll cycle (i.e., in the time interval between the time point $t_E$ and the time point $t_F$,) the write currents $I_{W1}$ and $I_{W2}$ are nearly equal because both of the two MRAM cells c1 and c2 are in the AP state.

Due to the process variation of the MRAM cells c1 and c2, it is unable to predict which of the storage elements $R_1$ and $R_2$ is first switched to the P state after the enroll action is completed. Consequently, the MRAM cells c1 and c2 can be applied to the PUF technology. Please refer to FIG. 5C again. In the time point $t_F$ within the enroll cycle, the storage element $R_1$ of the MRAM cells c1 has been switched to the P state (i.e., the low impedance state). Meanwhile, the storage element $R_2$ of the MRAM cells c2 is still maintained in the AP state. Consequently, in the time interval between the time point $t_E$ and the time point $t_G$, the write current $I_{W1}$ increases, and the write current $I_{W2}$ decreases. In other words, the storage element $R_2$ of the MRAM cells c2 is certainly unable to be switched to the P state.

Figure 5D:
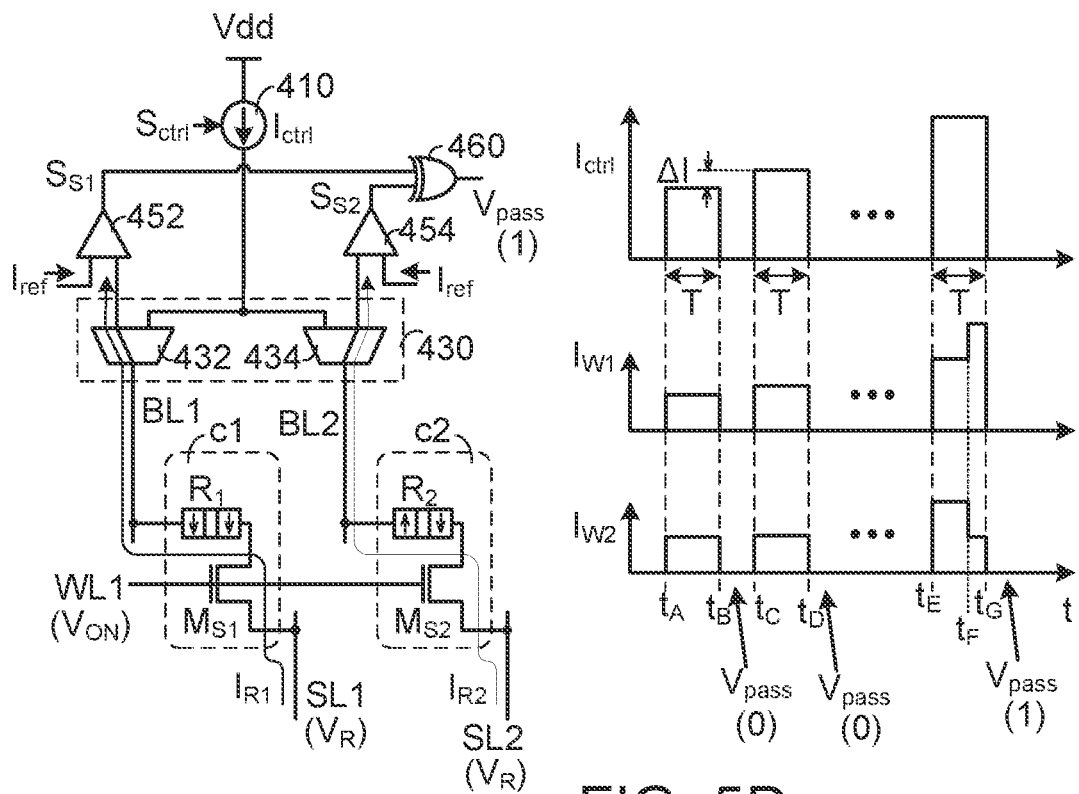

Please refer to FIG. 5D. After the enroll action is completed, another verification action is started at the time point $t_G$. While the verification action is performed, the bit lines BL1 and BL2 are respectively connected to the sensing elements 452 and 454 through the select circuit 430. In addition, the word line WL1 receives the on voltage $V_{ON}$, and the source lines SL1 and SL2 receives the read voltage $V_R$. Consequently, the read currents $I_{R1}$ and $I_{R2}$ generated by the MRAM cells c1 and c2 flow to the sensing elements 452 and 454, respectively.

Since the MRAM cell c1 is in the P state and MRAM cell c2 is in the AP state, the magnitude of the read current $I_{R1}$ is higher than the reference current $I_{ref}$, and the magnitude of the read currents $I_{R2}$ is lower than the reference current $I_{ref}$. Consequently, the sensing signals $S_{S1}$ and $S_{S2}$ generated by the sensing elements 452 and 454 have different logic levels to indicate that the MRAM cell c1 is in the P state and MRAM cell c2 is in the AP state. Since the sensing signals $S_{S1}$ and $S_{S2}$ have different logic levels, the verification signal $V_{pass}$ generated by the judging element 460 is in a high low level state "1" to indicate that the MRAM cell pair pass the verification action. Then, the random code generating process is ended. Under this circumstance, the storage state of the MRAM cell c1 or the MRAM cell c2 can be used as a one-bit random code. In other words, the MRAM cell array has generated a one-bit random code, and the one-bit random code is stored in the MRAM cell c1 or the MRAM cell c2. In case that an external circuit (not shown) intends to use the random code, the external circuit can perform a read action on the magnetoresistive random access memory to retrieve the random code from the MRAM cell c1 or the MRAM cell c2.

In some situations, the storage element $R_2$ of the MRAM cells c2 is switched to the P state, and the storage element $R_1$ of the MRAM cell c1 is maintained in the AP state. While the verification action is performed, the verification signal $V_{pass}$ generated by the judging element 460 is in the high low level state "1" to indicate that the MRAM cell pair pass the verification action.

From the above descriptions, the judging element 460 generates the verification signal $V_{pass}$ to indicate whether the MRAM cell pair pass the verification action or not while the verification action is performed. When the MRAM cell pair pass the verification action, it is confirmed that the MRAM cells c1 and c2 have different storage states, that is, a result of an exclusive-OR operation performed on two one-bit random codes stored in the MRAM cell c1 and the MRAM cell c2 is equal to 1. However, it is unable to realize which of the MRAM cells c1 and c2 has been changed to the P state. Consequently, the random code generating method of the present invention can be applied to the PUF technology.

It is noted that the applications of the random code generating method are not restricted to the 1×2 MRAM cell array. In some other embodiments, the random code generating method of the present invention can be applied to the MRAM cell array with a larger size.

Figure 6A:
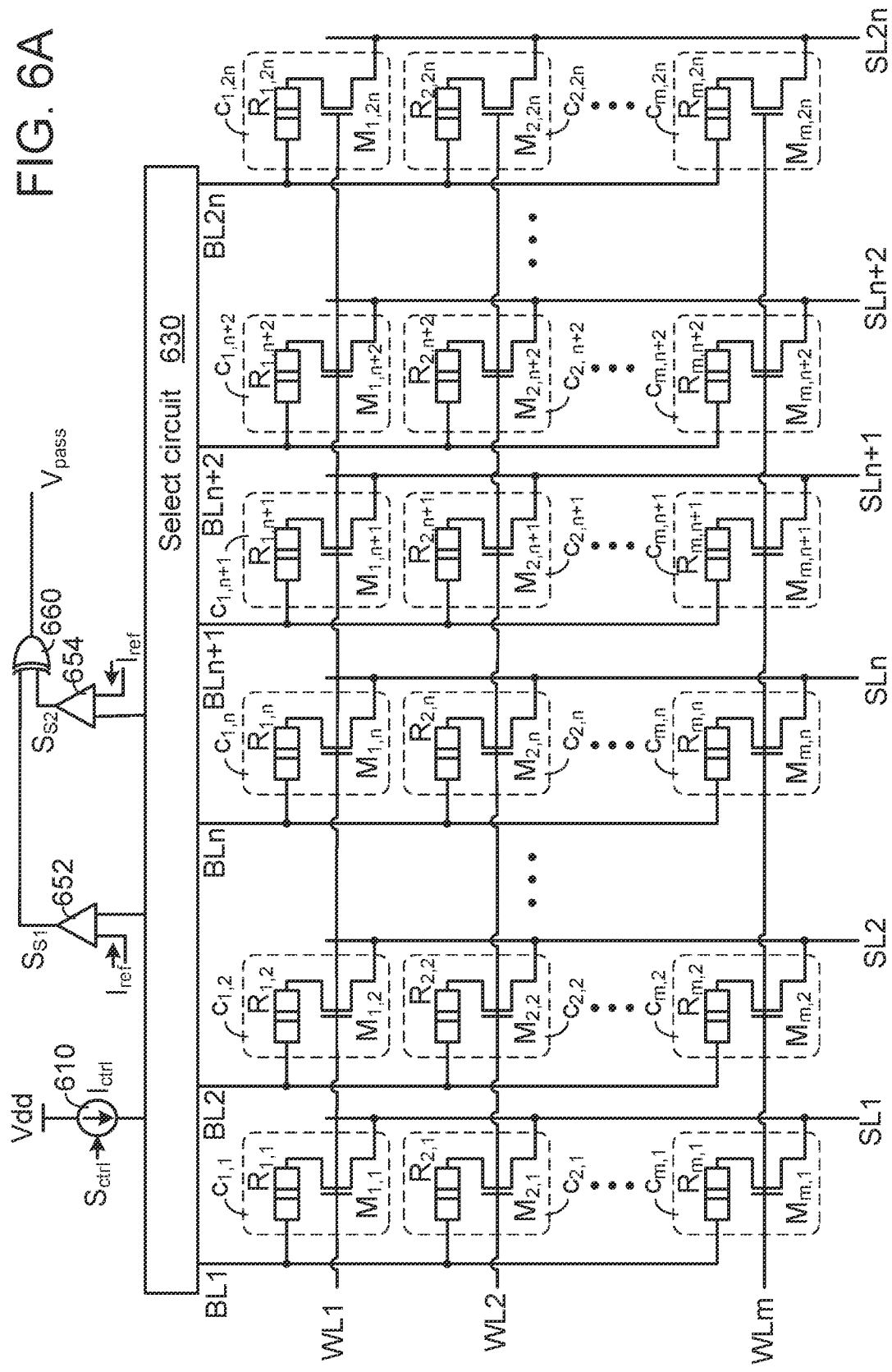
FIG. 6A is a schematic circuit diagram illustrating a magnetoresistive random access memory (MRAM) for a physically unclonable function (PUF) technology according to a second embodiment of the present invention.

FIG. 6A is a schematic circuit diagram illustrating a magnetoresistive random access memory (MRAM) for a physically unclonable function (PUF) technology according to a second embodiment of the present invention. The magnetoresistive random access memory comprises a MRAM cell array, a current source 610, a select circuit 630, two sensing elements 652, 654, and a judging element 660.

The MRAM cell array comprises plural MRAM cells $c_{1,1}$~$c_{m,2n}$, which are arranged in a m×2n array, wherein m and n are positive integers. In the MRAM cell array, each of the MRAM cells $c_{1,1}$~$c_{m,2n}$ comprises a switch transistor and a storage element. For example, the MRAM cell $c_{1,1}$ comprises a switch transistor $M_{1,1}$ and a storage element $R_{1,1}$. The structures of the MRAM cells $c_{1,1}$~$c_{m,2n}$ are similar to the structure of the MRAM cell 110 as shown in FIG. 1, and not redundantly described herein.

The control ends of the 2n MRAM cells $c_{1,1}$~$c_{1,2n}$ in the first row of the MRAM cell array are connected to the word line WL1. The first ends of the 2n MRAM cells $c_{1,1}$~$c_{1,2n}$ in the first row of the MRAM cell array are connected to the corresponding source lines SL1~SL2n, respectively. The second ends of the 2n MRAM cells $c_{1,1}$~$c_{1,2n}$ in the first row of the MRAM cell array are connected to the corresponding bit lines BL1~BL2$n$, respectively. The control ends of the 2n MRAM cells $c_{2,1}$~$c_{2,2n}$ in the second row of the MRAM cell array are connected to the word line WL2. The first ends of the 2n MRAM cells $c_{2,1}$~$c_{2,2n}$ in the second row of the MRAM cell array are connected to the corresponding source lines SL1~SL2$n$, respectively. The second ends of the 2n MRAM cells $c_{2,1}$~$c_{2,2n}$ in the second row of the MRAM cell array are connected to the corresponding bit lines BL1-BL2$n$, respectively. The rest may be deduced by analog. The control ends of the 2n MRAM cells $c_{m,1}$~$c_{m,2n}$ in the m-th row of the MRAM cell array are connected to the word line WL$m$. The first ends of the 2n MRAM cells $c_{m,1}$~$c_{m,2n}$ in the m-th row of the MRAM cell array are connected to the corresponding source lines SL1~SL2$n$, respectively. The second ends of the 2n MRAM cells $c_{m,1}$~$c_{m,2}$ in the m-th row of the MRAM cell array are connected to the corresponding bit lines BL1~BL2$n$, respectively.

When the magnetoresistive random access memory is applied to the PUF technology, any two MRAM cells in a row of the MRAM cell array are collaboratively formed as a MRAM cell pair, and the MRAM cell array in a row contains plural MRAM cell pairs. In other words, the enroll actions are performed on the plural MRAM cell pairs in the selected row. For example, as shown in FIG. 6A, the first row of the MRAM cell array contains n MRAM cell pairs. The MRAM cells $c_{1,1}$ and $c_{1,n+1}$ are collaboratively formed as a first MRAM cell pair of the first row. The MRAM cells $c_{1,2}$ and $c_{1,n+2}$ are collaboratively formed as a second MRAM cell pair of the first row. The rest may be deduced by analog. The MRAM cells $c_{1,n}$ and $c_{1,2n}$ are collaboratively formed as an n-th MRAM cell pair of the first row.

The current source 610 is connected between a power supply voltage Vdd and the select circuit 630. While an enroll action is performed, the current source 610 generates the control current $I_{ctrl}$. The control current $I_{ctrl}$ is a current pulse with a fixed pulse width. The magnitude of the control current $I_{ctrl}$ is equal to the pulse height of the current pulse. According to a control signal $S_{ctrl}$, the current source 610 adjusts the magnitude of the control current $I_{ctrl}$. That is, the pulse height of the current pulse can be adjusted according to the control signal $S_{ctrl}$.

The select circuit 630 is connected with the bit lines BL1~BL2$n$, the current source 610, the first input terminal of the sensing element 652 and the first input terminal of the sensing element 654. While the enroll action is performed, two of the bit lines are connected to the current source 610 by the select circuit 630. During a verification action, the two bit lines are connected to the first input terminal of the sensing element 652 and the first input terminal of the sensing element 654, respectively.

During the verification action, the sensing elements 652 and 654 and the judging element 660 are enabled. The second input terminal of the sensing element 652 receives a reference current $I_{ref}$. The output terminal of the sensing element 652 generates a sensing signal $S_{S1}$. The second input terminal of the sensing element 654 receives the reference current $I_{ref}$. The output terminal of the sensing element 654 generates a sensing signal $S_{S2}$. In an embodiment, the sensing elements 652 and 654 are current comparators.

The two input terminals of the judging element 660 are connected to the output terminals of the sensing elements 652 and 654 for receiving the sensing signals $S_{S1}$ and $S_{S2}$. For example, the judging element 660 is an XOR gate. During the verification operation, the output terminal of the judging element 660 generates a verification signal $V_{pass}$ to indicate whether the MRAM cell pair pass the verification action or not.

Figure 6B:
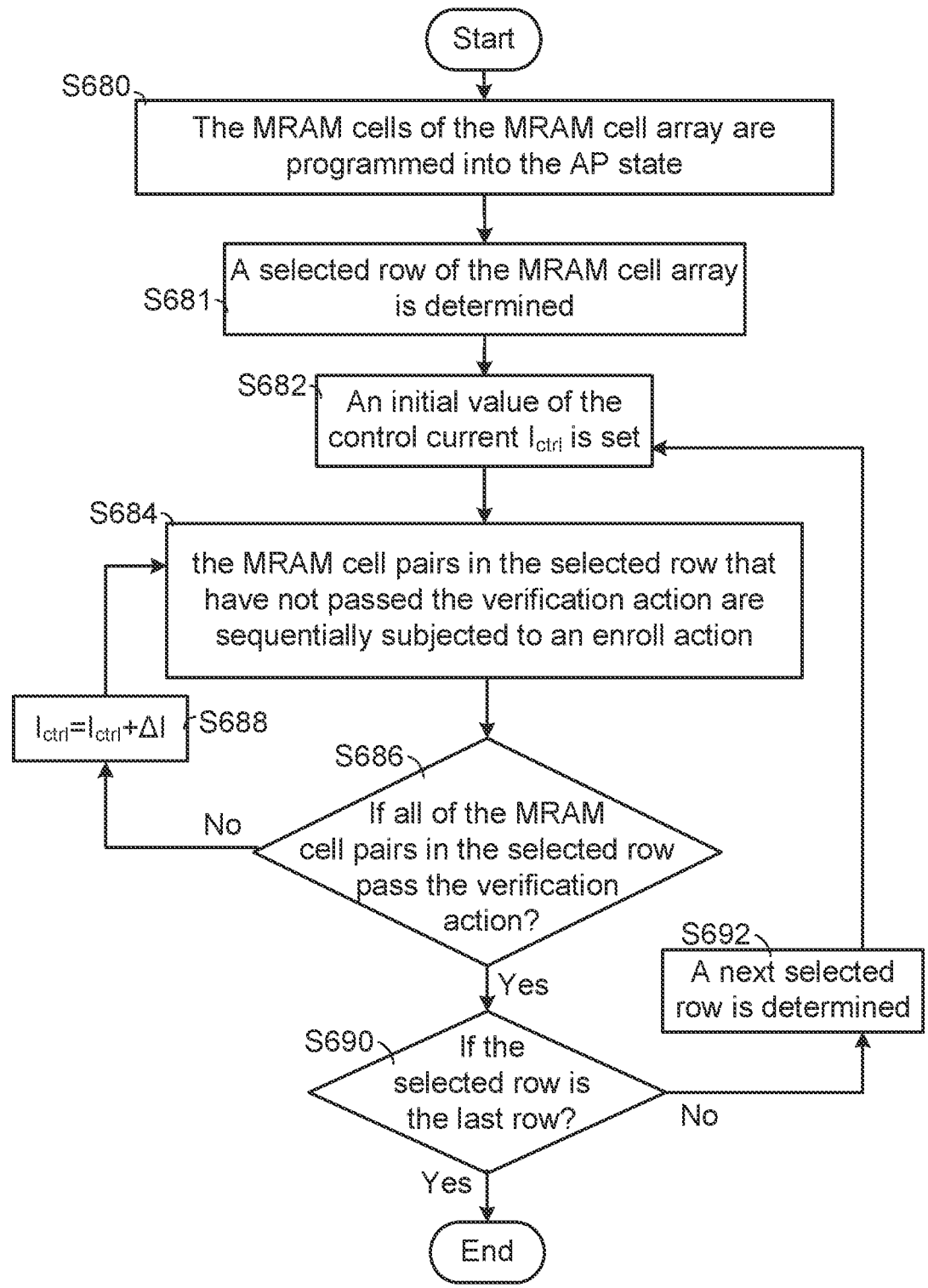
FIG. 6B is a flowchart illustrating a random code generating method for the magnetoresistive random access memory according to the second embodiment of the present invention.

FIG. 6B is a flowchart illustrating a random code generating method for the magnetoresistive random access memory according to the second embodiment of the present invention. Firstly, the MRAM cells c1,1~c$m$,2$n$ of the MRAM cell array are programmed into the AP state (Step S680). Then, a selected row of the MRAM cell array is determined (Step S681), and an initial value of the control current $I_{ctrl}$ is set (Step S682). That is, the control current $I_{ctrl}$ is adjusted according to the control signal $S_{ctrl}$. Consequently, the current pulse has the lowest pulse height.

Then, the MRAM cell pairs in the selected row that have not passed the verification action are sequentially subjected to an enroll action (Step S684). While the enroll action is performed, the control current $I_{ctrl}$ is divided into two portions, and the two portions are respectively provided to the two MRAM cells of the MRAM cell pair. That is, while the enroll action is performed, a first portion of the control current $I_{ctrl}$ is provided to the first MRAM cell of the MRAM cell pair, and a second portion of the control current $I_{ctrl}$ is provided to the second MRAM cell of the MRAM cell pair.

After the enroll action are performed on the MRAM cell pairs in the selected row that have not passed the verification action, a step S686 is performed to judge whether all of the MRAM cell pairs in the selected row pass the verification action. If the judging condition of the step S686 is not satisfied, the control current $I_{ctrl}$ is increased by a current increment (i.e., Ictrl=Ictrl+ΔI) (Step S688), and the step S684 is repeatedly done. That is, the control current $I_{ctrl}$ is adjusted according to the control signal $S_{ctrl}$. Consequently, the pulse height of the current pulse is increased.

Whereas, if the judging condition of the step S686 is satisfied, a step S690 is performed to judge whether the selected row is the last row of the MRAM cell array. If the judging condition of the step S690 is not satisfied, a next selected row is determined (Step S692). Whereas, if the judging condition of the step S690 is satisfied, the random code generating process is ended. After the random code generating process is ended, an m×n-bit random code is stored in the MRAM cell array.

Figure 7A:
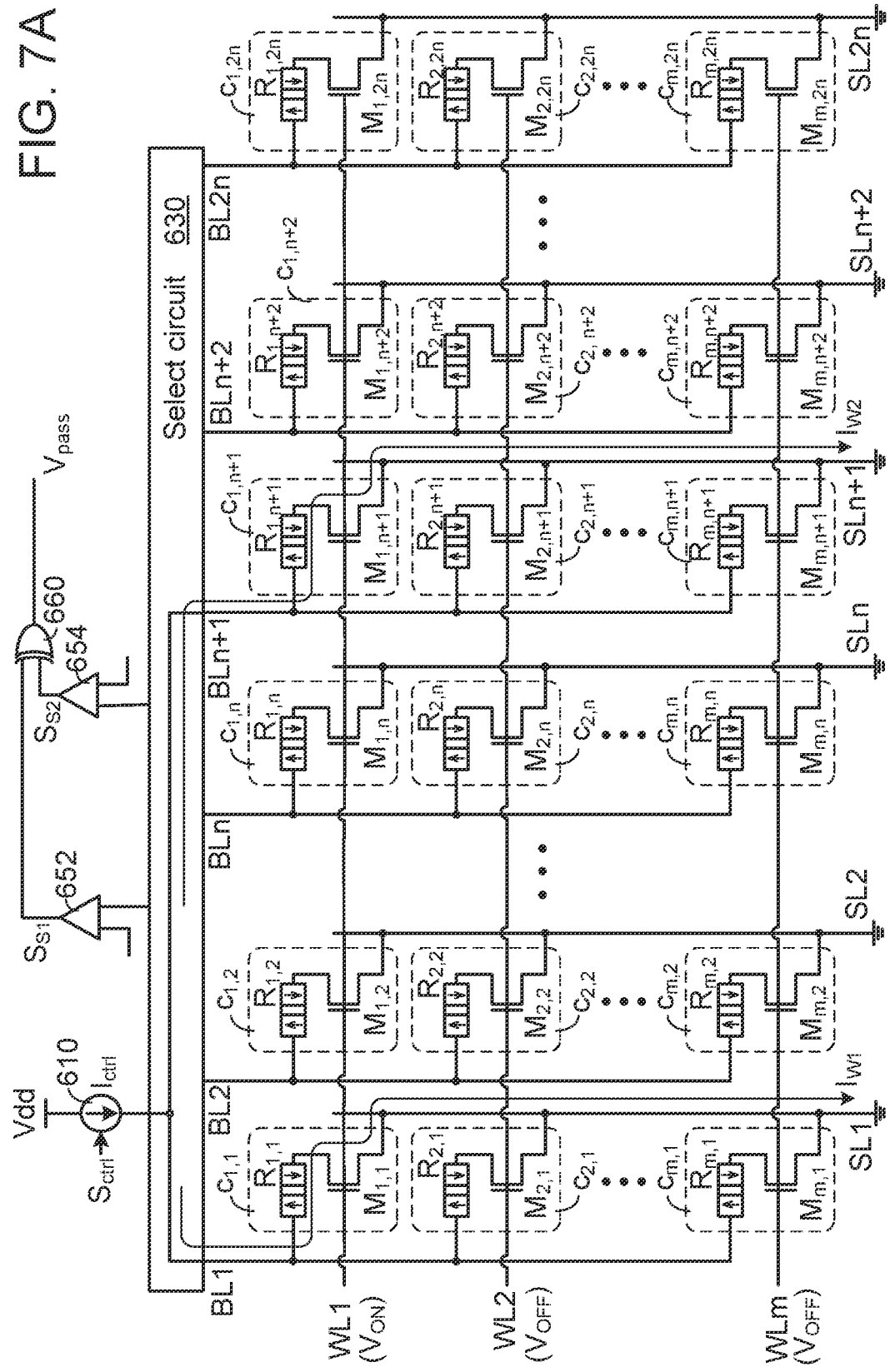
FIGS. 7A and 7B schematically illustrate the operations of the random code generating method when the enroll action and the verification action of the magnetoresistive random access memory are performed.
Figure 7B:
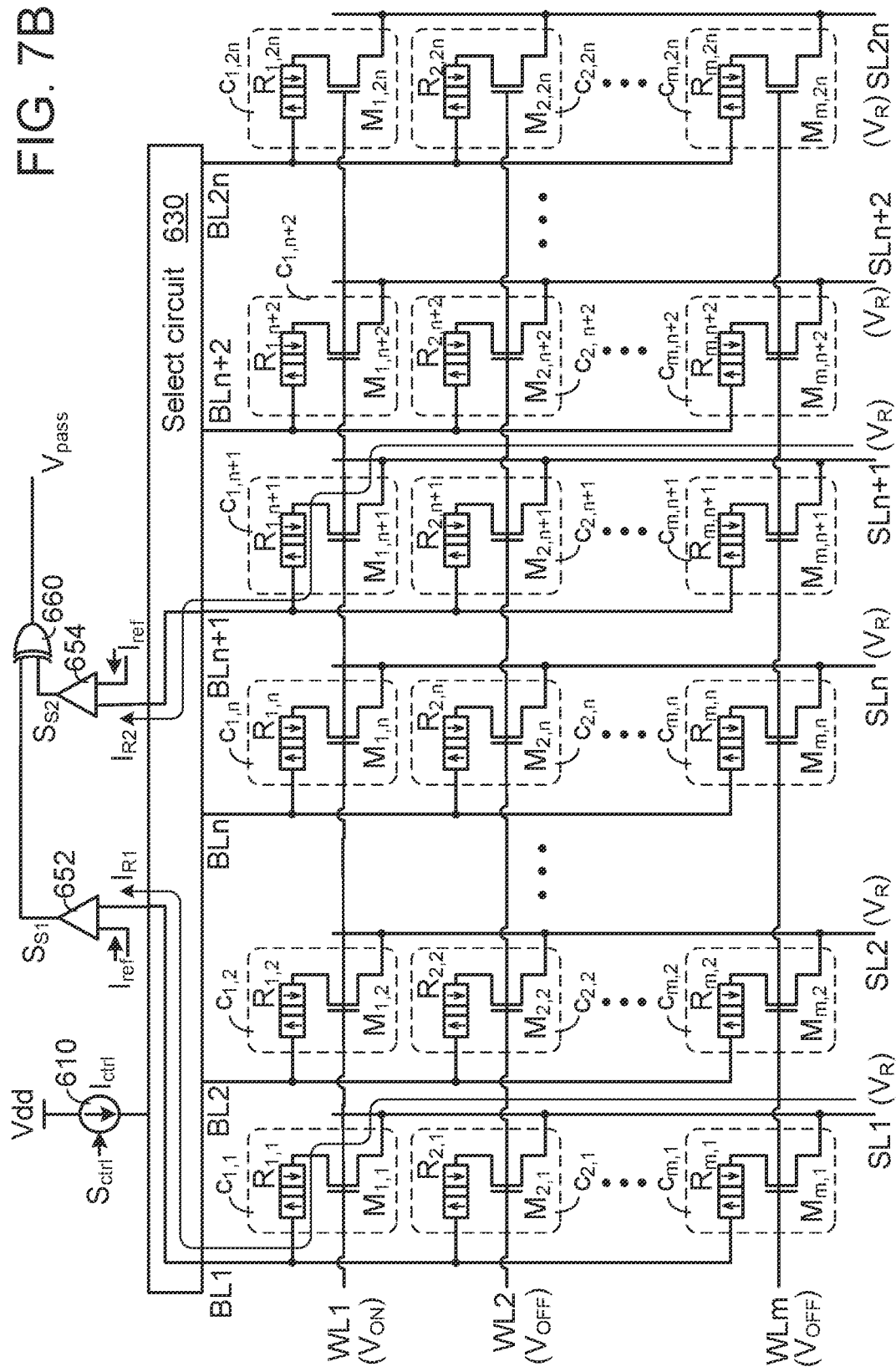

FIGS. 7A and 7B schematically illustrate the operations of the random code generating method when the enroll action and the verification action of the magnetoresistive random access memory are performed.

As shown in FIG. 7A, the storage elements $R_{1,1}$~$R_{m,2n}$ in all of the MRAM cells $c_{1,1}$~$c_{m,2n}$ of the MRAM cell array have been programmed into the AP state.

For example, the first row is the selected row. The word line WL1 receives the on voltage $V_{ON}$, and the other word lines WL2~WL$m$ receives an off voltage $V_{OFF}$. The selected row contains 2n MRAM cells $c_{1,1}$~$c_{1,2n}$. That is, the selected row contains n MRAM cell pairs. When the enroll action of the magnetoresistive random access memory on the selected row is started, all of the n MRAM cell pairs in the selected row have not passed the verification action. Consequently, n MRAM cell pairs are subjected to the enroll actions sequentially. In other words, n enroll actions are performed sequentially.

Please refer to FIG. 7A again. While the first enroll action is performed, the first bit line pair (i.e., the bit lines BL1 and BL$n$+1) are connected to the current source 610 through the select circuit 630, and the source lines SL1~SL2$n$ are connected to the ground terminal to receive the ground voltage (i.e., 0V). That is, the MRAM cells $c_{1,1}$ and $c_{1,n+1}$ are collaboratively formed as a first MRAM cell pair of the selected row. Consequently, the control current $I_{ctrl}$ generated by the current source 610 is divided into two portions (i.e., the write currents $I_{W1}$ and $I_{W2}$), wherein $I_{ctrl}=I_{W1}+I_{W2}$. The two portions of the control current $I_{ctrl}$ flow to the two MRAM cells $c_{1,1}$ and $c_{1,n+1}$, respectively.

Similarly, while the second enroll action is performed, the second bit line pair (i.e., the bit lines BL2 and BLn+2) are connected to the current source 610 through the select circuit 630. That is, the MRAM cells $c_{1,2}$ and $c_{1,n+2}$ are collaboratively formed as a second MRAM cell pair of the selected row. Consequently, the control current $I_{ctrl}$ generated by the current source 610 is divided into two portions (i.e., the write currents $I_{W1}$ and $I_{W2}$), wherein $I_{ctrl}=I_{W1}+I_{W2}$. The two portions of the control current $I_{ctrl}$ flow to the two MRAM cells $c_{1,2}$ and $c_{1,n+2}$, respectively. The above procedures are repeatedly performed until the n-th enroll action is completed.

After the n enroll actions are completed, n verification actions are performed. Please refer to FIG. 7B. While the first verification action is performed, the first bit line pair (i.e., the bit lines BL1 and BLn+1) are respectively connected to the first input terminal of the sensing element 652 and the first input terminal of the sensing element 654 through the select circuit 630, and the source lines SL1-SL2n receives a read voltage $V_R$. That is, the MRAM cells $c_{1,1}$ and $c_{1,n+1}$ are collaboratively formed as a first MRAM cell pair of the selected row. Consequently, the read currents $I_{R1}$ and $I_{R2}$ generated by the MRAM cells $c_{1,1}$ and $c_{1,n+1}$ flow to the sensing elements 652 and 654, respectively. By comparing the read current $I_{R1}$ with the reference current $I_{ref}$, the sensing element 652 generates a sensing signal $S_{S1}$. By comparing the read current $I_{R2}$ with the reference current $I_{ref}$, the sensing element 654 generates a sensing signal $S_{S2}$. According to the sensing signals $S_{S1}$ and $S_{S2}$, the judging element 660 generates a verification signal $V_{pass}$ to indicate whether the first MRAM cell pair passes the verification action or not. While the second verification action is performed, the second bit line pair (i.e., the bit lines BL2 and BLn+2) are respectively connected to the first input terminal of the sensing element 652 and the first input terminal of the sensing element 654 through the select circuit 630, and the source lines SL1-SL2n receives a read voltage $V_R$. That is, the MRAM cells $c_{1,2}$ and $c_{1,n+2}$ are collaboratively formed as a second MRAM cell pair of the selected row. Consequently, the read currents $I_{R1}$ and $I_{R2}$ generated by the MRAM cells $c_{1,2}$ and $c_{1,n+2}$ flow to the sensing elements 652 and 654, respectively. By comparing the read current $I_{R1}$ with the reference current $I_{ref}$, the sensing element 652 generates a sensing signal $S_{S1}$. By comparing the read current $I_{R2}$ with the reference current $I_{ref}$, the sensing element 654 generates a sensing signal $S_{S2}$. According to the sensing signals $S_{S1}$ and $S_{S2}$, the judging element 660 generates a verification signal $V_{pass}$ to indicate whether the first MRAM cell pair passes the verification action or not.

The above procedures are repeatedly performed until the n-th verification action is completed.

If at least one MRAM cell pair of the selected row fails to pass the verification actions after the n-th enroll action and the n-th verification action are completed, the control current $I_{ctrl}$ is increased according to the control signal $S_{ctrl}$. Then, the MRAM cell pairs of the selected row failing to pass the verification action are subjected to the enroll action and the verification action again. For example, x MRAM cell pairs of the selected row fail to pass the verification action. After these x MRAM cell pairs are sequentially subjected to the enroll actions according to the increased control current $I_{ctrl}$, these x MRAM cell pairs are sequentially subjected to x verification actions. The above procedures are repeatedly performed until all MRAM cell pairs of the selected row pass the verification actions.

When the first MRAM cell pair passes the verification action, it is only able to confirm that the two MRAM cells of the first MRAM cell pair have different storage states. However, it is unable to realize which of the two MRAM cells has been changed to the P state. Consequently, after all of the MRAM cells of the m×2n MRAM cell array pass the verification actions, it means that the MRAM cell array has generated an m×n-bit random code.

Please refer to FIG. 6A again. In an embodiment, the m×n-bit random code can be stored in the first n MRAM cells of each row in the MRAM cell array, i.e., the MRAM cells $c_{1,1}$~$c_{m,n}$. In another embodiment, the m×n-bit random code can be stored in the last n MRAM cells of each row in the MRAM cell array, i.e., the MRAM cells $c_{1,n+1}$~$c_{m,2n}$. In case that an external circuit (not shown) intends to use the random code, the external circuit can perform a read action on the magnetoresistive random access memory to retrieve the random code from the MRAM cells $c_{1,1}$~$c_{m,n}$ or the MRAM cells $c_{1,n+1}$~$c_{m,2n}$ of the MRAM cell array.

From the above descriptions, the present invention provides a magnetoresistive random access memory (MRAM) for a physically unclonable function (PUF) technology according to the characteristics of the magnetoresistive random access memory. The present invention also provides a random code generating method for allowing the magnetoresistive random access memory to generate random codes.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistive random access memory, comprising:
   a memory cell array comprising a first magnetoresistive random access memory cell and a second magnetoresistive random access memory cell, wherein a control end of the first magnetoresistive random access memory cell is connected to a word line, a first end of the first magnetoresistive random access memory cell is connected to a first source line, and a second end of the first magnetoresistive random access memory cell is connected to a first bit line, wherein a control end of the second magnetoresistive random access memory cell is connected to the word line, a first end of the second magnetoresistive random access memory cell is connected to a second source line, and a second end of the second magnetoresistive random access memory cell is connected to a second bit line;
   a current source receiving a control signal and generating a control current according to the control signal;
   a select circuit connected to the current source, the first bit line and the second bit line;
   a first sensing element, wherein a first input terminal of the first sensing element is connected to the select circuit, a second input terminal of the first sensing element receives a reference current, and an output terminal of the first sensing element generates a first sensing signal according to the reference current and a first read current generated by the first magnetoresistive random access memory cell;

a second sensing element, wherein a first input terminal of the second sensing element is connected to the select circuit, a second input terminal of the second sensing element receives the reference current, and an output terminal of the second sensing element generates a second sensing signal according to the reference current and a second read current generated by the second magnetoresistive random access memory cell; and a judging element, wherein a first input terminal of the judging element is connected to the output terminal of the first sensing element, a second input terminal of the judging element is connected to the output terminal of the second sensing element, and an output terminal of the judging element generates a verification signal according to the first sensing signal and the second sensing signal, wherein both of the first magnetoresistive random access memory cell and the second magnetoresistive random access memory cell are initially in an anti-parallel state, wherein while an enroll action is performed, the current source is connected to the first bit line and the second bit line through the select circuit, so that a first portion of the control current flows through the first magnetoresistive random access memory cell and a second portion of the control current flows through the second magnetoresistive random access memory cell, wherein while a verification action is performed, the first bit line and the second bit line are respectively connected to the first input terminal of the first sensing element and the first input terminal of the second sensing element through the select circuit, so that the first read current flows to the first sensing element and the second read current flows to the second sensing element.

2. The magnetoresistive random access memory as claimed in claim 1, wherein the control current is a current pulse with a fixed pulse width, and a pulse height of the current pulse is adjustable according to the control signal.

3. The magnetoresistive random access memory as claimed in claim 1, wherein while the enroll action is performed, the word line receives an on voltage, and the first source line and the second source line receive a ground voltage.

4. The magnetoresistive random access memory as claimed in claim 1, wherein while the verification action is performed, the word line receives an on voltage, and the first source line and the second source line receive a read voltage.

5. The magnetoresistive random access memory as claimed in claim 4, wherein while the verification action is performed, the first sensing element generates the first sensing signal according to a result of comparing the first read current with the reference current, the second sensing element generates the second sensing signal according to a result of comparing the second read current with the reference current.

6. The magnetoresistive random access memory as claimed in claim 5, wherein if the verification signal indicates that the first magnetoresistive random access memory cell and the second magnetoresistive random access memory cell fail to pass the verification action, both of the first magnetoresistive random access memory cell and the second magnetoresistive random access memory cell are maintained in the anti-parallel state.

7. The magnetoresistive random access memory as claimed in claim 5, wherein if the verification signal indicates that the first magnetoresistive random access memory cell and the second magnetoresistive random access memory cell pass the verification action, one of the first magnetoresistive random access memory cell and the second magnetoresistive random access memory cell is maintained in the anti-parallel state, and the other of the first magnetoresistive random access memory cell and the second magnetoresistive random access memory cell is switched to a parallel state.

8. The magnetoresistive random access memory as claimed in claim 7, wherein if the verification signal indicates that the first magnetoresistive random access memory cell and the second magnetoresistive random access memory cell pass the verification action, the first magnetoresistive random access memory cell or the second magnetoresistive random access memory cell stores a one-bit random code.

9. The magnetoresistive random access memory as claimed in claim 1, wherein the first magnetoresistive random access memory cell comprises a switch transistor and a storage element, wherein a first drain/source terminal of the switch transistor is connected to the first source line, a gate terminal of the switch transistor is connected to the word line, a second drain/source terminal of the switch transistor is connected to a first terminal of the storage element, a second terminal of the storage element is connected to the first bit line, and the storage element is a magnetic tunnel junction.

10. A random code generating method for the magnetoresistive random access memory according to claim 1, the random code generating method comprising steps of:
  (a) programming the first magnetoresistive random access memory cell and the second magnetoresistive random access memory cell into the anti-parallel state;
  (b) setting an initial value of the control current;
  (c) performing the enroll action on the first magnetoresistive random access memory cell and the second magnetoresistive random access memory cell;
  (d) if the first magnetoresistive random access memory cell and the second magnetoresistive random access memory cell fail to pass the verification action, increasing the control current by a current increment, and performing the step (c) again; and
  (e) if the first magnetoresistive random access memory cell and the second magnetoresistive random access memory cell pass the verification action, ending the random code generating process;
  Wherein a one-bit random code is stored in the first magnetoresistive random access memory cell or the second magnetoresistive random access memory cell after the step (e) is performed.

11. The random code generating method as claimed in claim 10, wherein the control current is a current pulse with a fixed pulse width, and a pulse height of the current pulse is increased when the control current is increased by the current increment.

12. A magnetoresistive random access memory, comprising:
  a memory cell array comprising m×2n magnetoresistive random access memory cells in an m×2n array arrangement, wherein the memory cell array is connected to m word lines, 2n bit lines and 2n source lines, wherein 2n magnetoresistive random access memory cells in a first row of the memory cell array are collaboratively formed as n magnetoresistive random access memory cell pairs, control ends of the 2n magnetoresistive random access memory cells are connected to a first word line, first ends of the 2n magnetoresistive random access memory cells are connected to corresponding 2n source lines, and second ends of the 2n magnetoresistive random access memory cell are connected to corresponding n bit lines, a current source receiving a control signal and generating a control current according to the control signal;

a select circuit connected to the current source and the 2n bit lines;

a first sensing element, wherein a first input terminal of the first sensing element is connected to the select circuit, a second input terminal of the first sensing element receives a reference current, and an output terminal of the first sensing element generates a first sensing signal;

a second sensing element, wherein a first input terminal of the second sensing element is connected to the select circuit, a second input terminal of the second sensing element receives the reference current, and an output terminal of the second sensing element generates a second sensing signal; and a judging element, wherein a first input terminal of the judging element is connected to the output terminal of the first sensing element, a second input terminal of the judging element is connected to the output terminal of the second sensing element, and an output terminal of the judging element generates a verification signal, wherein while an enroll action is performed, the current source is connected to a pair of bit lines of the 2n bit lines through the select circuit, and the current source is connected to a specified magnetoresistive random access memory cell pair of the n magnetoresistive random access memory cell pairs, so that a first portion of the control current flows through a first magnetoresistive random access memory cell of the specified magnetoresistive random access memory cell pair and a second portion of the control current flows through a second magnetoresistive random access memory cell of the specified magnetoresistive random access memory cell pair, wherein while a verification action is performed, the pair of bit lines of the 2n bit lines are respectively connected to the first input terminal of the first sensing element and the first input terminal of the second sensing element through the select circuit, so that a first read current generated by the first magnetoresistive random access memory cell of the specified magnetoresistive random access memory cell pair flows to the first sensing element and a second read current generated by the second magnetoresistive random access memory cell of the specified magnetoresistive random access memory cell pair flows to the second sensing element.

13. The magnetoresistive random access memory as claimed in claim 12, the control current is a current pulse with a fixed pulse width, and a pulse height of the current pulse is adjustable according to the control signal.

14. The magnetoresistive random access memory as claimed in claim 12, wherein while the enroll action is performed, the first word line receives an on voltage, and the 2n source lines receive a ground voltage.

15. The magnetoresistive random access memory as claimed in claim 12, wherein while the verification action is performed, the first word line receives an on voltage, and the 2n source lines receives a read voltage.

16. The magnetoresistive random access memory as claimed in claim 15, wherein while the verification action is performed, the first sensing element generates the first sensing signal according to a result of comparing the first read current with the reference current, the second sensing element generates the second sensing signal according to a result of comparing the second read current with the reference current, and the judging element generates the verification signal according to the first sensing signal and the second sensing signals.

17. The magnetoresistive random access memory as claimed in claim 16, wherein if the verification signal indicates that the first magnetoresistive random access memory cell and the second magnetoresistive random access memory cell of the specified magnetoresistive random access memory cell pair fail to pass the verification action, both of the first magnetoresistive random access memory cell and the second magnetoresistive random access memory cell are maintained in an anti-parallel state.

18. The magnetoresistive random access memory as claimed in claim 16, wherein if the verification signal indicates that the first magnetoresistive random access memory cell and the second magnetoresistive random access memory cell of the specified magnetoresistive random access memory cell pair pass the verification action, one of the first magnetoresistive random access memory cell and the second magnetoresistive random access memory cell is maintained in an anti-parallel state, and the other of the first magnetoresistive random access memory cell and the second magnetoresistive random access memory cell is switched from the anti-parallel state to a parallel state.

19. The magnetoresistive random access memory as claimed in claim 18, wherein if the verification signal indicates that the first magnetoresistive random access memory cell and the second magnetoresistive random access memory cell of the specified magnetoresistive random access memory cell pair pass the verification action, the first magnetoresistive random access memory cell or the second magnetoresistive random access memory cell stores a one-bit random code.

20. The magnetoresistive random access memory as claimed in claim 12, wherein the first magnetoresistive random access memory cell comprises a switch transistor and a storage element, wherein a first drain/source terminal of the switch transistor is connected to a first source line of the n source lines, a gate terminal of the switch transistor is connected to the word line, a second drain/source terminal of the switch transistor is connected to the first terminal of the storage element, a second terminal of the storage element is connected to a first bit line of the 2n bit lines, and the storage element is a magnetic tunnel junction.

21. A random code generating method for the magnetoresistive random access memory according to claim 12, the random code generating method comprising steps of:

(a) programming the m×2n magnetoresistive random access memory cells of the memory cell array into an anti-parallel state;

(b) determining a selected row of the memory cell array;

(c) setting an initial value of the control current;

(d) performing the enroll action on plural magnetoresistive random access memory cell pairs in the selected row sequentially, wherein the plural magnetoresistive random access memory cell pairs have not passed the verification action;

(e) if at least one magnetoresistive random access memory cell pair in the selected row fails to pass the verification action, increasing the control current by a current increment, and performing the step (d) again;

(f) if all of the magnetoresistive random access memory cell pairs in the selected row pass the verification action and the selected row is not a last row of the memory cell array, determining a next selected row, and performing the step (c) again; and (g) if all of the magnetoresistive random access memory cell pairs in the selected row pass the verification action and the selected row is the last row of the memory cell array, ending the random code generating process;

Wherein an m×n-bit random code is stored in the memory cell array after the step (g) is performed.

22. The random code generating method as claimed in claim 21, wherein the control current is a current pulse with a fixed pulse width, and a pulse height of the current pulse is increased when the control current is increased by the current increment.

* * * * *